United States Patent
Noh et al.

(10) Patent No.: US 10,283,382 B2
(45) Date of Patent: May 7, 2019

(54) PLASMA PROCESSING APPARATUS

(71) Applicant: SAMSUNG ELECTRONICS CO., LTD., Suwon-si, Gyeonggi-do (KR)

(72) Inventors: Young Jin Noh, Ansan-si (KR); Kyung Sun Kim, Suwon-si (KR); Seung Bo Shim, Seoul (KR); Yong Woo Lee, Hwaseong-si (KR); Ji Soo Im, Seongnam-si (KR); Won Young Choi, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/672,623

(22) Filed: Aug. 9, 2017

(65) Prior Publication Data

US 2018/0182647 A1 Jun. 28, 2018

(30) Foreign Application Priority Data

Dec. 23, 2016 (KR) ........................ 10-2016-0177651

(51) Int. Cl.
| | |
|---|---|
| *H01L 21/3065* | (2006.01) |
| *H01L 21/67* | (2006.01) |
| *C23C 16/458* | (2006.01) |
| *H01J 37/32* | (2006.01) |
| *C23C 16/509* | (2006.01) |
| *H01L 21/683* | (2006.01) |
| *H01L 21/687* | (2006.01) |

(52) U.S. Cl.
CPC .... *H01L 21/67069* (2013.01); *C23C 16/4585* (2013.01); *C23C 16/5096* (2013.01); *H01J 37/32642* (2013.01); *H01J 37/32724* (2013.01); *H01L 21/67109* (2013.01); *H01L 21/67248* (2013.01); *H01L 21/6831* (2013.01); *H01L 21/68735* (2013.01)

(58) Field of Classification Search
CPC ......... H01L 37/32495; H01L 37/32623; H01L 37/32091
See application file for complete search history.

(56) References Cited

U.S. PATENT DOCUMENTS

| | | | |
|---|---|---|---|
| 6,514,347 | B2 | 2/2003 | Denpoh |
| 7,176,403 | B2 | 2/2007 | Steger |
| 7,244,336 | B2 | 7/2007 | Fischer et al. |
| 8,449,679 | B2 | 5/2013 | Dhindsa |
| 8,555,810 | B2 | 10/2013 | Park et al. |
| 8,894,806 | B2 | 11/2014 | Koshimizu et al. |
| 9,076,636 | B2 | 7/2015 | Ohata et al. |

(Continued)

FOREIGN PATENT DOCUMENTS

| | | |
|---|---|---|
| KR | 10-2009-0050606 A | 5/2009 |
| KR | 10-2011-0083979 A | 7/2011 |

*Primary Examiner* — Robert M Kunemund
(74) *Attorney, Agent, or Firm* — Lee & Morse, P.C.

(57) ABSTRACT

A plasma processing apparatus including an electrostatic chuck supporting a wafer; a focus ring disposed to surround an outer circumferential surface of the wafer; an insulation ring disposed to surround an outer circumferential surface of the focus ring; and an edge ring supporting lower portions of the focus ring and the insulation ring, the edge ring being spaced apart from the electrostatic chuck and surrounding an outer circumferential surface of the electrostatic chuck; wherein the edge ring includes a flow channel containing a fluid therein.

18 Claims, 11 Drawing Sheets

(56) References Cited

U.S. PATENT DOCUMENTS

| | | |
|---|---|---|
| 9,184,074 B2 | 11/2015 | Dhindsa et al. |
| 2010/0012274 A1 | 1/2010 | Miyagawa et al. |
| 2011/0272100 A1* | 11/2011 | Koshiishi .......... H01J 37/32623 156/345.43 |
| 2012/0176692 A1 | 7/2012 | Yamawaku et al. |
| 2014/0335698 A1* | 11/2014 | Singh ................ H01J 37/32495 118/500 |
| 2015/0011097 A1* | 1/2015 | Fischer ............. H01J 37/32091 438/798 |

* cited by examiner

PLASMA PROCESSING APPARATUS

CROSS-REFERENCE TO RELATED APPLICATION

Korean Patent Application No. 10-2016-0177651, filed on Dec. 23, 2016, in the Korean Intellectual Property Office, and entitled: "Plasma Processing Apparatus," is incorporated by reference herein in its entirety.

BACKGROUND

1. Field

Embodiments relate to a plasma processing apparatus.

2. Description of the Related Art

A system for accelerating a desired chemical reaction (deposition, etching, or the like) by using plasma has been used in industries such as semiconductor LCD and LED.

A system using plasma may include a chamber in which processes are performed, a source to generate plasma, a pump and pressure controller to maintain a high vacuum in the chamber, and a support ring, electrostatic chuck (ESC), and electrode to adjust the temperature and plasma energy of an object to be processed while supporting and fixing the object to be processed. A focus ring and an insulation ring surrounding the outer circumferential surface of the focus ring may be disposed on the periphery of the edge of the object to be processed, e.g., a semiconductor wafer.

SUMMARY

The embodiments may be realized by providing a plasma processing apparatus including an electrostatic chuck supporting a wafer; a focus ring disposed to surround an outer circumferential surface of the wafer; an insulation ring disposed to surround an outer circumferential surface of the focus ring; and an edge ring supporting lower portions of the focus ring and the insulation ring, the edge ring being spaced apart from the electrostatic chuck and surrounding an outer circumferential surface of the electrostatic chuck; wherein the edge ring includes a flow channel containing a fluid therein.

The embodiments may be realized by providing a plasma processing apparatus including a plasma chamber supplied with plasma; an electrostatic chuck disposed in the plasma chamber and supporting a wafer; an edge ring spaced apart from the electrostatic chuck, the edge ring surrounding an outer circumferential surface of the electrostatic chuck and including a flow channel containing a fluid therein; a focus ring surrounding an outer circumferential surface of the wafer and disposed on the edge ring; and a fluid controller to control a supply of the fluid contained in the flow channel of the edge ring, wherein the edge ring and the electrostatic chuck form a capacitor, and the fluid controller controls an amount and temperature of the fluid contained in the edge ring.

The embodiments may be realized by providing a plasma processing apparatus including an electrostatic chuck supporting a wafer; a focus ring surrounding an outer circumferential surface of the wafer; an insulating ring surrounding an outer circumferential surface of the focus ring, the insulating ring containing a material that is different from a material contained in the focus ring; and an edge ring in contact with at least a part of the focus ring and the insulation ring, wherein the edge ring includes a flow channel containing a coolant therein, and a temperature of the focus ring and the edge ring is controlled by the coolant during a plasma process for the wafer.

The embodiments may be realized by providing a plasma processing apparatus including an electrostatic chuck on which a wafer is supportable; a focus ring surrounding an outer circumferential surface of a location where the wafer is to be supported; an insulation ring surrounding an outer circumferential surface of the focus ring; and an edge ring supporting the focus ring and the insulation ring, the edge ring being spaced apart from the electrostatic chuck and surrounding an outer circumferential surface of the electrostatic chuck; wherein the edge ring includes a flow channel through which a fluid is flowable.

BRIEF DESCRIPTION OF THE DRAWINGS

Features will be apparent to those of skill in the art by describing in detail exemplary embodiments with reference to the attached drawings in which.

DETAILED DESCRIPTION

Hereinafter, a plasma processing apparatus according to an embodiment of the present disclosure will be described with reference to FIGS. 1 to 11.

Figure 1:
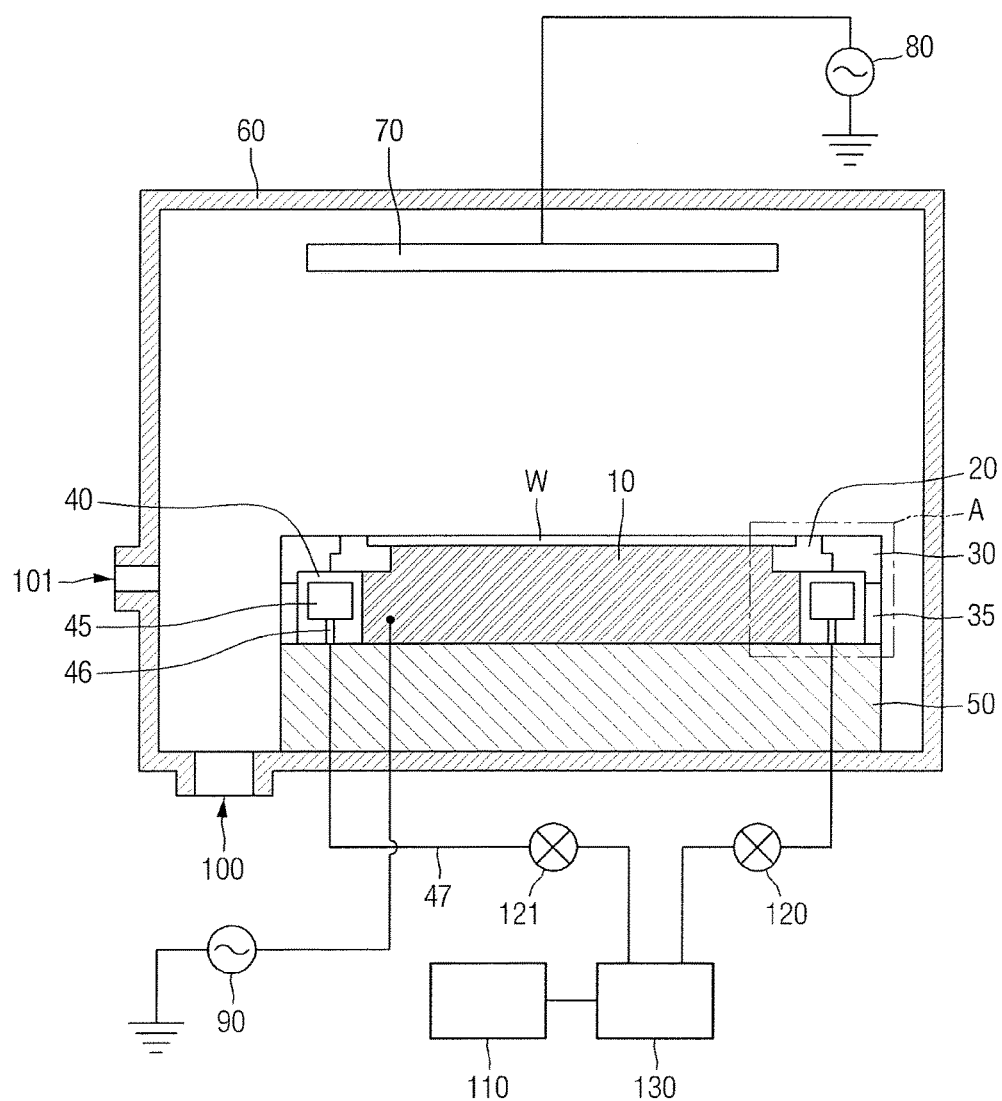
FIG. 1 illustrates a sectional view of a plasma processing apparatus according to an embodiment of the present disclosure.
Figure 2:
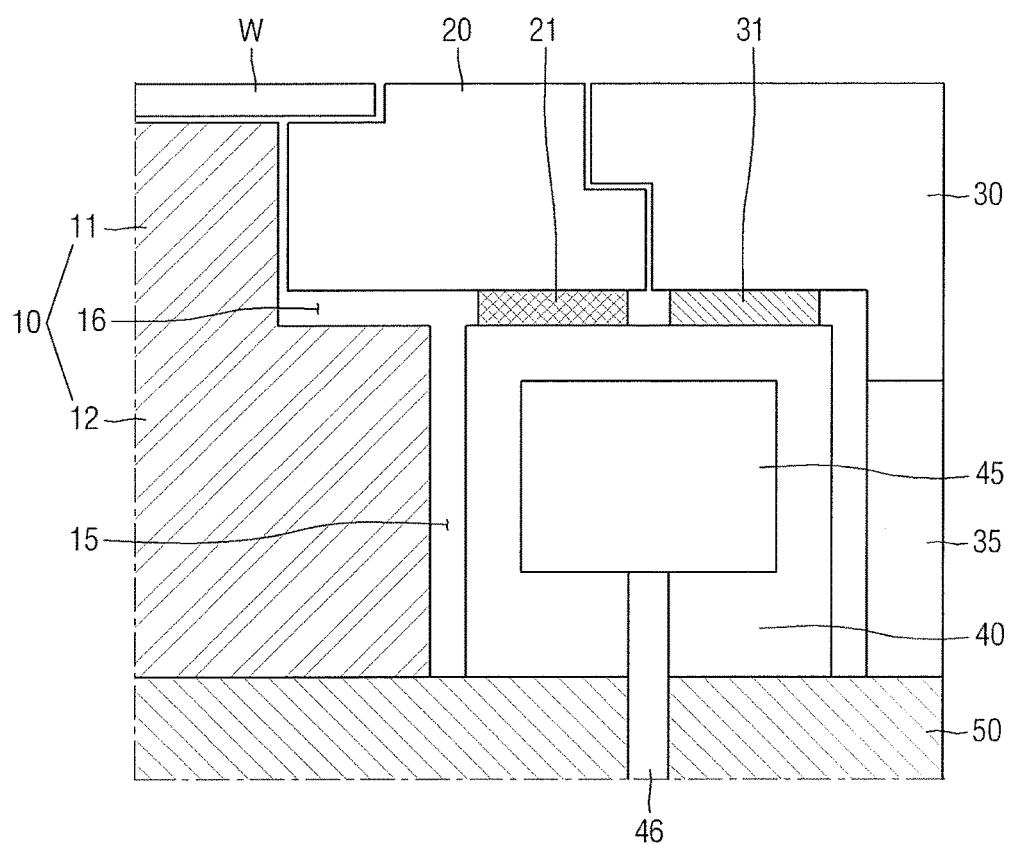
FIG. 2 illustrates an enlarged sectional view of A of FIG. 1.

FIG. 1 illustrates a sectional view of a plasma processing apparatus according to an embodiment of the present disclosure. FIG. 2 illustrates an enlarged sectional view of A of FIG. 1.

Referring to FIGS. 1 and 2, the plasma processing apparatus according to an embodiment of the present disclosure may include an electrostatic chuck 10 supporting a wafer W (e.g., an electrostatic chuck 10 on which a wafer W is supportable), an edge ring 40 surrounding the electrostatic chuck 10, a focus ring 20 (at least a part of the focus ring being in contact with the edge ring 40), an insulation ring 30 surrounding the focus ring 20, and a chamber 60.

The electrostatic chuck 10 may support an object to be processed, e.g., a semiconductor wafer W. For example, a voltage may be applied to the lower portion of the electrostatic chuck 10 to generate an electrostatic force on the electrostatic chuck 10. The wafer W may be placed on the electrostatic chuck 10, e.g., may be held on the electrostatic chuck 10) by the electrostatic force formed on the electrostatic chuck 10.

The electrostatic chuck 10 may have a shape similar to that of the wafer W. For example, the electrostatic chuck 10 may be formed in a same or similar circular shape as the wafer W.

In an implementation, the wafer W may be disposed on the electrostatic chuck 10 such that at least a part thereof protrudes in an outer circumferential direction of the electrostatic chuck 10. For example, damage to the electrostatic chuck 10 in the plasma processing process for the wafer W may be prevented, e.g., because the plasma generated by the plasma processing apparatus may be provided on an upper surface of the wafer W and may not be provided on an upper surface of the electrostatic chuck 10.

The electrostatic chuck 10 may include an upper portion 11 facing the wafer W and a lower portion facing an isolator 50. As shown in FIG. 1, diameters of the upper portion 11 and the lower portion 12 may be different from each other, e.g., the diameter of the lower portion 12 may be larger than the diameter of the upper portion 11. When the diameter of the lower portion 12 is larger than the diameter of the upper portion 11, as shown in FIG. 1, the electrostatic chuck 10 may have a stepped structure. In an implementation, the diameter of the upper portion 11 of the electrostatic chuck 10 may be equal to the diameter of the lower portion 12 of the electrostatic chuck 10, and thus the electrostatic chuck 10 may not include a separate step, e.g., stepped structure.

The electrostatic chuck 10 may support the lower surface of the wafer W, and may cool the wafer W (to be plasma-processed). When plasma is supplied onto the wafer W, the surface of the wafer W may be etched, and the surface temperature of the wafer W may rapidly increase. If the surface temperature of the wafer W were to excessively increase, the wafer W could be deformed and/or damaged. In order to help reduce and/or prevent this phenomenon, the electrostatic chuck 10 may be provided with a flow channel through which a coolant flows or is flowable. For example, the coolant may flow through the flow channel, thereby controlling a surface temperature of the wafer W disposed on the electrostatic chuck 10. In an implementation, e.g., helium (He) or the like may be used on or provided to the surface of the electrostatic chuck 10.

The focus ring 20 may be disposed so as to surround an outer circumferential surface of the wafer W. The focus ring may surround a part of the electrostatic chuck 10 on which the wafer W is disposed. For example, the focus ring 20 may surround the upper portion of the electrostatic chuck 10. Simultaneously, the focus ring 20 may cover at least a part of an upper surface of the lower portion 12 of the electrostatic chuck 10.

The focus ring 20 may have a ring shape (e.g., provided with a hole) to surround the electrostatic chuck 10. For example, the electrostatic chuck 10 may be insertable into the hole formed in the focus ring 20 when viewed from an upper surface direction of the focus ring 20 and the electrostatic chuck 10 (e.g., in plan view or vertical downward direction of FIGS. 1 and 2).

The focus ring 20 may help expand a surface of the wafer W during a plasma processing process for processing the wafer W. During the plasma processing process, plasma may concentrate at an end of the wafer W, e.g., an outer circumferential surface or edge of the wafer W. Therefore, dry etching may not be uniformly performed, and degree of etching may be unbalanced. Accordingly, the focus ring 20 may surround the outer circumferential surface of the wafer W, thereby expanding the surface area of the wafer W, e.g., expanding an effective plasma processing area. In an implementation, due to the focus ring 20, plasma may not concentrate on the outer circumferential surface of the wafer W, so that the etching unbalance may not occur. Plasma may also be applied to the upper surface of the focus ring 20 during the plasma processing process, so that a part of the focus ring 20 may be etched. In an implementation, a plasma concentration may be uniform across an entire surface of the wafer W.

In order for the focus ring 20 to expand the surface area of the wafer W, the focus ring 20 may be made of a same material as a material contained in the wafer W. For example, the focus ring 20 may contain silicon.

The focus ring 20 may receive a part of the plasma during the plasma processing process for the wafer W, and the temperature of the focus ring 20 may increase. As described above, the electrostatic chuck 10 may include the flow channel through which a coolant for cooling the wafer W flows. Although the temperature increase of the wafer W may be controlled during the plasma processing process, the upper surface of the focus ring 20 may not be cooled. If the temperature of the upper surface of the focus ring 20 were to be different from the temperature of the surface of the wafer W (e.g., due to lack of cooling of the upper surface of the focus ring 20), the plasma provided to the surfaces of the wafer W and the focus ring 20 could be unbalanced.

The plasma processing apparatus according to an embodiment of the present disclosure may be provided with a separate cooling unit or cooler capable of cooling the focus ring 20, like the coolant flow channel for cooling the wafer W. For example, such a cooler may be included in the edge ring 40. Details thereof will be described below.

In an implementation, when the focus ring 20 contains the same material as the wafer W, e.g., silicon, the focus ring 20 may have the properties of an electrode as an electrical conductor. Therefore, a kind of capacitor may be formed inside or at the focus ring 20 and the plasma chamber 60. When the focus ring 20 is etched during the plasma processing process, a level of the upper surface of the focus ring 20 may be lowered, and the capacitance of the capacitor formed by the focus ring 20 and the plasma chamber 60 may be changed. If the capacitance of the capacitor formed by the focus ring 20 and the plasma chamber 60 were to be changed, a distribution of an electric field of the wafer W and the upper surface of the focus ring 20 could be changed, and thus the distribution of the plasma supplied to the wafer W could also be changed.

In order to help reduce and/or prevent a process unbalance due to such changes, the plasma processing apparatus according to the embodiment of the present disclosure may control the fluid supplied to a flow channel 45 in the edge ring 40, so as to compensate for the change in capacitance between the focus ring 20 and the plasma chamber 60. Details thereof will be described below.

Similar to the electrostatic chuck 10 having the stepped structure, e.g., including the upper portion 11 and the lower portion 12, the outer circumferential surface of the focus ring 20 may also have a step or stepped structure. Such a step may help prevent the plasma provided on the upper surface of the focus ring 20 from reaching the edge ring 40.

The focus ring 20 may be connected to the edge ring 40 via a first pad 21 (e.g., of the focus ring 20). When a fluid is supplied to the edge ring 40 in order to control the temperature of the focus ring 20, heat from the focus ring 20 may be provided to the edge ring 40 through the first pad 21 contacting the upper surface of the edge ring 40. Accordingly, the first pad 21 may contain a material having high thermal conductivity, e.g., may contain a silicon-based adhesive material.

Through the first pad 21, the lower portion of the focus ring 20 may be supported by and/or contact the edge ring 40.

A gap 16 may be formed between the lower portion 12 of the electrostatic chuck 10 and the focus ring 20. A capacitance may be formed between the focus ring 20 and the electrostatic chuck 10 by the gap 16 between the focus ring 20 and the lower portion 12. Details thereof will be described below.

The insulation ring 30 may surround the outer circumferential surface of the focus ring 20. The insulation ring 30 may contain a material that is different from a material contained in the focus ring 20. For example, the insulation ring 30 may contain a material having etching resistance with respect to the focus ring 20 in an etching process performed in the plasma processing process.

In an implementation, the insulation ring 30 may contain an insulating material, e.g., may contain quartz when the focus ring 20 contains silicon. In an implementation, it may be sufficient that the insulation ring 30 has etching resistance against the plasma provided during the plasma processing process for the wafer W.

As described above, the focus ring 20 may contain the same material as the wafer W, and thus may function as a kind of electrode. If the diameter of the focus ring 20 were to increase to cover all the upper surfaces of the edge ring 40 and a support ring 35, the area of the electrode formed by the focus ring 20 also increases.

If the area of the electrode formed by the focus ring 20 were to excessively increase, the etching process of the wafer W could be influenced by changing a distribution or size of the electric field formed on the wafer W and the focus ring 20.

The insulation ring 30 may contain a different material from the focus ring 20, e.g., may contain an insulating material. The insulation ring 30 may to cover the upper surfaces of the edge ring 40 and the supporting ring 35, thereby limiting a size of the electrode formed by the focus ring 20 to some degree.

In an implementation, plasma may also be provided to the upper surface of the insulation ring 30 during the plasma processing process for the wafer W. The temperature of the insulation ring 30 provided with the plasma may increase. Similar to the case of the focus ring 20, when the insulation ring 30 is heated, the temperature of the insulation ring 30 may be unbalanced with the temperature of the upper surface of the wafer W, and an unbalance could occur in the plasma provided to the surfaces of the wafer W and the insulation ring 30.

Therefore, the plasma processing apparatus according to an embodiment of the present disclosure may be provided with a separate cooling unit or cooler to cool the insulation ring 30, like the coolant flow channel for cooling the wafer W. As described above, this cooler may be included in the edge ring 40. Details thereof will be described below.

The insulation ring 30 may have a ring shape provided with a hole to surround the electrostatic chuck 10 and the focus ring 20. When viewed from the upper surface direction of the insulation ring 30 and the electrostatic chuck 10 (e.g., in a plan view or vertical downward direction of FIGS. 1 and 2), the electrostatic chuck 10 and the focus ring 20 may be insertable into the hole in the insulation ring 30.

The insulation ring 30 may be connected to the edge ring 40 via a second pad 31. For example, through the second pad 31, the lower portion of the insulation ring 30 may be supported by or contact the edge ring 40.

When a fluid is supplied to the edge ring 40 (in order to control the temperature of the insulation ring 30), the heat from the insulation ring 30 may be provided to the edge ring 40 through the second pad 31 contacting the upper surface of the edge ring 40. In an implementation, the second pad 31 may contain a material having high thermal conductivity, e.g., may contain a silicon-based adhesive material.

The insulation ring 30 may also be supported by the support ring 35. The support ring 35 may control or support the lower portion of the insulation ring 30, and may help prevent plasma from being provided onto the side of the edge ring 40. As shown in FIG. 1, the support ring 35 may surround the outer circumferential surface of the edge ring 40 while being spaced apart from the edge ring 40 by a predetermined distance. In an implementation, the support ring 35 may contain a material having etching resistance against a plasma etching gas, e.g., quartz. The support ring 35 may at least partially contact the isolator 50, and may also be supported by the isolator 50.

The isolator 50 may be disposed beneath the electrostatic chuck 10, the edge ring 40, and the support ring 35. In an implementation, the isolator 50 may support the electrostatic chuck 10, the edge ring 40, and the support ring 35.

During the plasma processing process using the plasma processing apparatus according to the embodiment of the present disclosure, an RF power may be applied to the electrostatic chuck 10 by a second power source 90. A source gas provided into an inlet 101 may be excited into plasma by the RF power applied to the electrostatic chuck 10 together with an RF power applied to an upper electrode 70 by a first power source 80. The radicals and ions contained in the plasma may etch the wafer W disposed on the electrostatic chuck 10.

The isolator 50 may be penetrated by a passage 46 through which the fluid provided into the edge ring 40 flows. Therefore, the fluid provided into the edge ring 40 may pass through a part of the isolator 50.

In an implementation, the isolator 50 may contain an insulating material, e.g., may contain a ceramic.

The edge ring 40 may surround the outer circumferential surface of the electrostatic chuck 10. For example, as shown in FIG. 2, the edge ring 40 may surround the outer circumferential surface of the lower portion 12 of the electrostatic chuck 10. For example, the edge ring 40 may horizontally overlap the lower portion 12 of the electrostatic chuck 10 (e.g., may be laterally adjacent to the lower portion 12 of the electrostatic chuck 10).

In an implementation, the edge ring 40 may also horizontally overlap at least a part of the upper portion 11 of the electrostatic chuck 10, depending on the position of the focus ring 20 and/or the insulation ring 30.

The edge ring 40 may be horizontally or laterally spaced apart from the electrostatic chuck 10, e.g., with the gap 15 therebetween. Here, the 'horizontal direction' may mean the outer circumferential or radial direction of the electrostatic chuck 10 or the wafer W on the electrostatic chuck 10. For example, the edge ring 40 may be spaced apart from the chuck 10 (with a gap 15 therebetween) by a predetermined distance in the radial direction of the electrostatic chuck 10, so as to surround the outer circumferential surface of the electrostatic chuck 10.

The edge ring 40 may be spaced from the electrostatic chuck 10 (with the gap 15 therebetween), and when the plasma processing process is started by the application of the RF powers from the electrostatic chuck 10 and the upper electrode 70, a capacitor (C1 of FIG. 5), in which the edge ring 40 and the electrostatic chuck 10 respectively act as electrodes, may be formed. For example, the capacitance of the capacitor (C1 of FIG. 5) formed between the edge ring 40 and the electrostatic chuck 10 may be controlled depending on the temperature or amount of the fluid flowing through the flow channel 45 provided in the edge ring 40. Details thereof will be described below.

The edge ring 40 may have a ring shape (provided with a hole) to surround the electrostatic chuck 10. For example, the electrostatic chuck 10 may be insertable into the hole in the edge ring 40 when viewed from the upper surface direction of the edge ring 40 and the electrostatic chuck 10 (e.g., in plan view or a vertical downward direction of FIGS. 1 and 2).

The edge ring 40 may be in contact with the focus ring 20 via the first pad 21 (e.g., the first pad 21 may be a part of the focus ring 20). For example, the focus ring 20 may be on the edge ring 40, and may be supported by the edge ring 40 through or at the first pad 21. The first pad 21 may provide the cooling effect of the edge ring 40 to the focus ring 20. For example, the heat of the focus ring 20 (generated during the plasma processing process) may be transferred to the edge ring 40 through the first pad 21.

The edge ring 40 may be in contact with the insulation ring 30 via the second pad 31 (e.g., the second pad 31 may be a part of the insulation ring 30). For example, the insulation ring 30 may be on the edge ring 40, and may be supported by the edge ring 40 through or at the second pad 31. The second pad 31 may provide the cooling effect of the edge ring 40 to the insulation ring 30. For example, the heat of the insulation ring 30 (generated during the plasma processing process) may be transferred to the edge ring 40 through the second pad 31.

In an implementation, a contact area between the edge ring 40 and the focus ring 20 and a contact area between the edge ring 40 and the insulation ring 30 may be different from each other. For example, the (e.g., magnitude of the) area of the first pad 21 that contacts the edge ring 40 and the (e.g., magnitude of the) area of the second pad 31 that contacts the edge ring 40 may be different from each other. As described above, the material of the focus ring 20 and the material of the insulating ring 30 may be different from each other. Therefore, in order to keep the temperature of the focus ring 20 and the temperature of the insulation ring 30 equal to each other during the plasma processing process, the cooling effects, e.g., cooling abilities of the focus ring 20 and the insulating ring 30, provided by the edge ring 40, may be different from each other.

In an implementation, the contact area between the edge ring 40 and the focus ring 20 and the contact area between the edge ring 40 and the insulation ring 30 may be equal to each other, and the thickness of the first pad 21 and the thickness of the second pad 31 may be different from each other. In an implementation, the thickness of the first pad 21 and the thickness of the second pad 31 may be equal to each other, the area of the first pad 21 and the area of the second pad 31 may be equal to each other, and the material of the first pad 21 and the material of the second pad 31 may be different from each other. Details thereof will be described below.

In an implementation, the edge ring 40 may contain a metallic material. In an implementation, the edge ring 40 may contain, e.g., aluminum. When the edge ring 40 contains a metallic material, the volume of the edge ring 40 may relatively expand or contract depending on the change in temperature of or amount of the fluid supplied to the flow channel 45 in the edge ring 40.

The flow channel 45 (for containing or directing the fluid) may be formed in the edge ring 40. In an implementation, the fluid in the flow channel 45 may be a coolant. In an implementation, the coolant may be liquid or gas. In an implementation, the coolant may include, e.g., helium (He) gas when the coolant is gas, and may include, e.g., water when the coolant is liquid. In an implementation, the coolant may be a suitable coolant capable of performing the temperature control of the focus ring 20 and the insulating ring 30.

The coolant or fluid may be supplied from a fluid supply 130 to the flow channel 45 through pumps 120 and 121. The fluid supply 130 may be a container that accommodates fluid. The passage 46 may be formed between the fluid supply 130 and the flow channel 45. The passage 46 may penetrate the isolator 50 and the edge ring 40 to connect the flow channel 45 and the fluid supply 130.

In an implementation, the fluid supplied to the flow channel 45 may be the same as the coolant or fluid supplied to the electrostatic chuck 10. For example, during the plasma processing process, the coolant or fluid may be supplied to the electrostatic chuck 10 in order to cool the wafer W on the electrostatic chuck 10, and the same coolant or fluid may also be supplied to the flow channel 45 in the edge ring 40. The edge ring 40 and the electrostatic chuck 10 may receive the coolant or fluid from the same fluid supply 130, and may cool the focus ring 20, the insulation ring 30, and the wafer W.

A fluid controller 110 may control the supply of the fluid to the flow channel 45 in the edge ring 40. For example, the fluid controller 110 may control the amount of the fluid supplied from the fluid supply 130 to the flow channel 45 by controlling the pumps 120 and 121 on a supply line 47. As will be described below, the capacitance of the capacitor (C1 of FIG. 5) between the edge ring 40 and the electrostatic chuck 10 may be adjusted by adjusting the amount of the fluid supplied to the flow channel 45. Details thereof will be described below.

In an implementation, the fluid controller 110 may control the temperature of the fluid supplied to the flow channel 45. The fluid supplied to the flow channel 45 may be supplied to the supply line 47 in a state of being cooled by the fluid supply 130. The fluid controller 110 may control the temperature of the focus ring 20 and the temperature of the insulation ring 30 by controlling the temperature of the fluid supplied to the flow channel 45. The fluid supply 130 may include a cooler that can control the temperature of the internal fluid according to the control of the fluid controller 110. In an implementation, the cooler may include a thermoelectric cooler.

In an implementation, the internal temperature of the edge ring 40 to which the fluid is supplied may also be changed depending on the temperature of the fluid. When the internal temperature of the edge ring 40 is changed, the volume of the edge ring 40 may also be changed. The fluid controller 110 may control the volume expansion or contraction of the edge ring 40 and the width of the gap 15 between the edge ring 40 and the electrostatic chuck 10 by controlling the temperature of the fluid and/or amount of the fluid provided, e.g., by controlling an amount of heat transferred away from the edge ring 40. For example, the fluid controller 110 may be a device that provides electrical control signals to the pumps 120 and 121 in response to data (e.g., temperature data) received from the edge ring 40.

The plasma processing apparatus according to some embodiments of the present disclosure may include a chamber 60 that provides a space for performing the plasma processing process, e.g., a dry etching process, for the wafer W.

The chamber 60 may include an inlet 101 and an outlet 100, which may be selectively opened and closed under control. The source gas used in the plasma processing process may be supplied into the chamber 60 through the inlet 101. By-products generated by the plasma processing process may be discharged through the outlet 100. In an implementation, as shown in FIG. 1, one inlet 101 and one outlet 100 may be formed in the chamber 60. In an implementation, the chamber 60 may include a plurality of inlets 101 and a plurality of outlets 100.

The upper electrode 70 may be surround or be at the upper portion of the chamber 60. In an implementation, seven upper electrodes 70 may be arranged in the chamber 60. In an implementation, the number of the upper electrodes 70 may be changed according to the design intention of the plasma processing apparatus according to an embodiment of the present disclosure.

The upper electrode 70 may be supplied with RF power from the first power source 80, and may be synchronized with a lower electrode, so as to excite the source gas supplied into the chamber 60 into plasma.

In an implementation, the plasma processing apparatus according to an embodiment of the present disclosure may include an electric field measurer in the chamber 60. The electric field measurer may measure the distribution of an electric field in the chamber 60 and the distribution of plasma in the chamber 60 due to the distribution of the electric field during the plasma processing process performed by the plasma processing apparatus. The measured plasma or electric field distribution may be provided to the fluid controller 110, and the fluid controller 110 may control the temperature or amount of the fluid provided to the edge ring 40 based on the measurement results.

Figure 3:
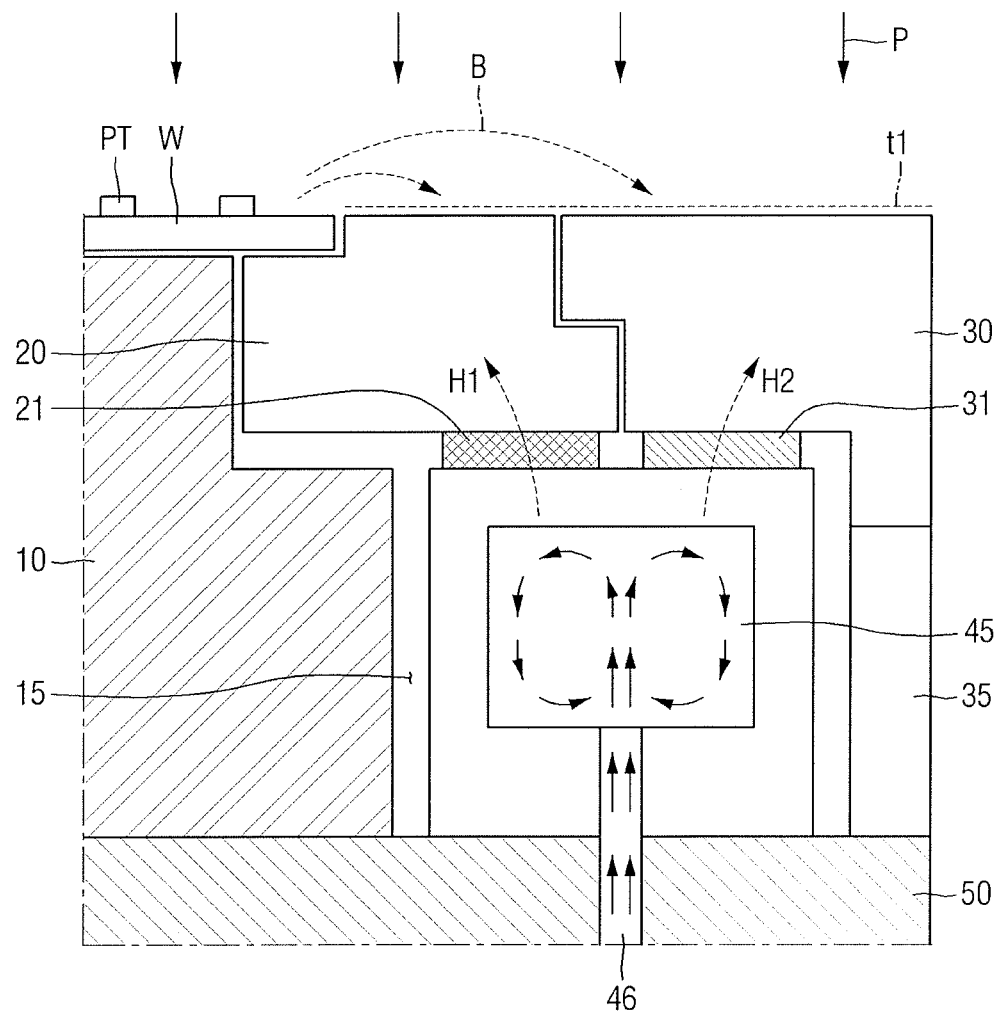
FIG. 3 illustrates a schematic view showing the operation of an edge ring included in the plasma processing apparatus according to an embodiment of the present disclosure.

FIG. 3 illustrates a sectional view showing the operation of the plasma processing apparatus according to an embodiment of the present disclosure.

Referring to FIG. 3, excited plasma may be supplied to the plasma processing apparatus according to an embodiment of the present disclosure, and an etching process for forming a pattern PT on the wafer W may be performed. In FIG. 3, P schematically indicates the distribution of the plasma supplied to the upper surfaces of the wafer W, the focus ring 20, and the insulation ring 30.

Simultaneously with the supply of the plasma, fluid may be supplied to the flow channel 45 in the edge ring 40. As described above, the fluid supplied to the flow channel 45 may be a coolant. When the coolant is supplied to the flow channel 45, the focus ring 20 and the insulation ring 30 may be cooled during the plasma processing process.

During the plasma processing process, the focus ring 20 and the insulation ring 30 may be maintained at the same temperature t1. The by-products (B) generated in the plasma processing process may adhere to a lower temperature side.

If a difference in temperature between the focus ring 20 and the insulating ring 30 were to occur, an imbalance in adhesion of the by-products B could occur, which could then damage the uniformity during the process. Accordingly, the upper surface temperatures of the focus ring 20 and the insulating ring 30 may be maintained at the same temperature t1 by the coolant supplied to the flow channel 45 in the edge ring 40, so as to maintain the uniformity.

In an implementation, as described above, the focus ring 20 and the insulating ring 30 included in the plasma processing apparatus according to an embodiment of the present disclosure may contain different materials from each other. For this reason, the thermal conductivity of the focus ring 20 and the thermal conductivity of the insulating ring 30 may be different from each other, and it may be possible for the upper surface temperatures of the focus ring 20 and the insulating ring 30 to not be maintained at the same temperature t1. Accordingly, for the same temperature control of the focus ring 20 and the insulation ring 30, the configuration of the first pad 21 (of the focus ring 20) on the edge ring 40 may be different from the configuration of the second pad 31 (of the insulation ring 30) on the edge ring 40.

A heat flow rate Q between the edge ring 40 and the focus ring 20 and between the edge ring 40 and the insulation ring 30 by the first and second pads 21 and 31 is represented by Q=k×A (ΔT/L) (here, k is thermal conductivity, A is the area of the first and second pads 21 and 31, ΔT is the temperature difference between the edge ring 40 and the focus ring 20 and between the edge ring 40 and the insulation ring 30 where the first pad 21 contacts the edge ring 40 and the second pad 31 contacts the edge ring 40, and L is the thickness of the first and second pads 21 and 31).

In an implementation, e.g., if the first pad 21 contains silicon and the second pad 31 contains quartz, the thermal conductivity of silicon is greater than the thermal conductivity of quartz. Assuming that the first pad 21 and the second pad 31 have the same thickness, the second area where the second pad 31 contacts the edge ring 40 may be larger than the first area where the first pad 21 contacts the edge ring 40.

In an implementation, the first area where the first pad 21 contacts the edge ring 40 may be equal to the second area where the second pad 31 contacts the edge ring 40, and the thickness of the first pad 21 may be different from the thickness of the second pad 31. In an implementation, the first pad 21 and the second pad 31 may contain materials having different thermal conductivity.

The edge ring 40 (including the flow channel 45) may transfer first heat H1 to or from the focus ring 20, and provides second heat H2 to or from the insulation ring 30, so as to allow the focus ring 20 and the insulation ring 30 to have different cooling effects from each other.

The fluid supplied to the flow channel 45 may circulate in the flow channel 45. In an implementation, as shown in FIG. 3, one passage 46 may be connected to the flow channel 45. In an implementation, the flow channel 45 may be connected with a plurality of passages, and each of the passages may function as an inlet or outlet of fluid.

Figure 4:
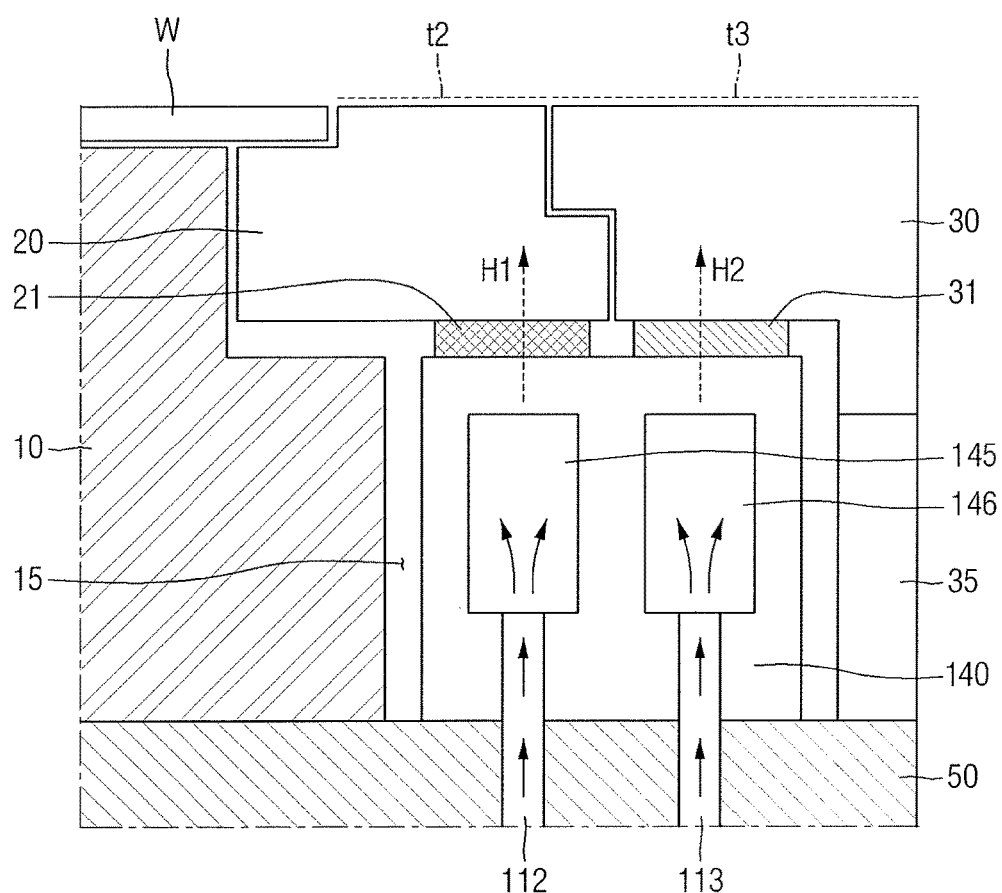
FIG. 4 illustrates a schematic view showing the operation of an edge ring included in a plasma processing apparatus according to another embodiment of the present disclosure.

FIG. 4 illustrates a schematic view showing the operation of an edge ring included in a plasma processing apparatus according to another embodiment of the present disclosure.

Referring to FIG. 4, the plasma processing apparatus according to another embodiment of the present disclosure may include an edge ring 140 having a different type from the above-described type. The edge ring 140 may include two flow channels 145 and 146 therein. Hereinafter, contents overlapping those described above may be omitted, and differences will be mainly described.

The first flow channel 145 may be connected to a first passage 112, and may be disposed to vertically overlap the focus ring 20 (e.g., may be vertically aligned with the focus ring 20). For example, the first flow channel 145 may be disposed to vertically overlap the first pad 21. The fluid supplied to the first flow channel 145 may be controlled to cool the focus ring 20.

The second flow channel 146 may be connected to a second passage 113, and may be disposed to vertically overlap the insulation ring 30 (e.g., may be vertically aligned with the insulation ring 30). For example, the second flow channel 146 may be disposed to vertically overlap the second pad 31. The fluid supplied to the second flow channel 146 may be controlled to cool the insulation ring 30.

In an implementation, the fluid supply (130 of FIG. 1) may be separately connected to the first flow channel 145 and the second flow channel 146.

The plasma processing apparatus according to the present embodiment may include the first flow channel 145 disposed to vertically overlap the focus ring 20 and the second flow channel 146 disposed to vertically overlap the insulation ring 30, thereby separately performing the temperature control of the focus ring 20 and the insulation ring 30.

In the plasma processing apparatus according to the present embodiment, different kinds of fluids may be supplied to the first flow channel 145 and the second flow channel in order to perform the temperature control of the focus ring 20 and insulation ring 30 containing different materials from each other. In an implementation, fluids of the same kind but different in temperature may be supplied to the first flow channel 145 and the second flow channel 146.

The fluid controller 110 may control the supply of different fluids contained in the first flow channel 145 and the second flow channel 146. In an implementation, the fluid controller 110 may control the fluid supply 130 such that the temperature of the fluid contained in the first flow channel 145 and the temperature of the fluid contained in the second flow channel 146 are different from each other.

In an implementation, the fluid controller 110 may also independently control the temperature t2 of the focus ring 20 and the temperature t3 of the insulation ring 30. For example, the temperature t2 of the focus ring 20 and the temperature t3 of the insulation ring 30, which are controlled by the fluid controller 110, may be different from each other.

Figure 5:
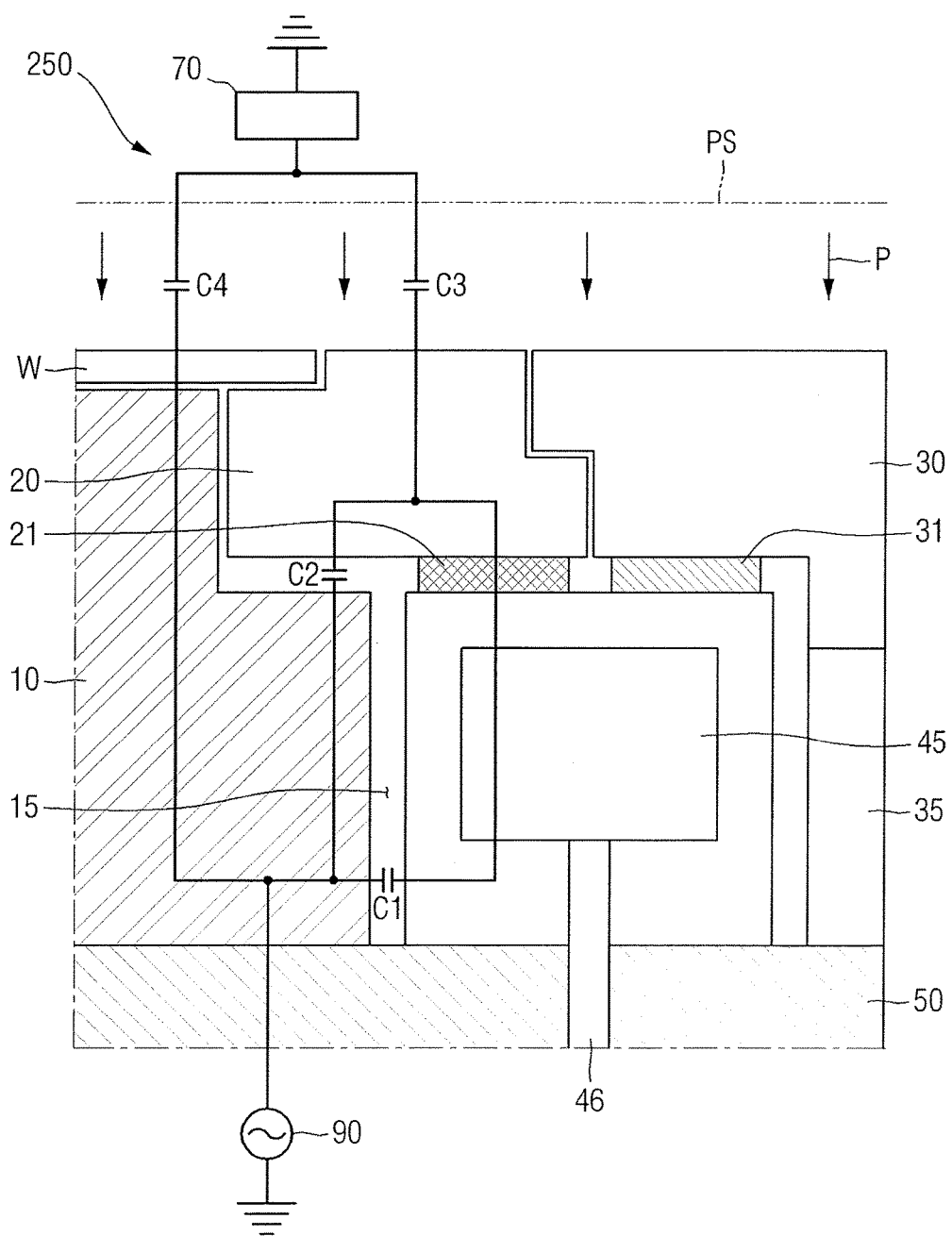
FIG. 5 illustrates a schematic view showing a circuit constituted by the plasma processing apparatus according to an embodiment of the present disclosure.
Figure 6:
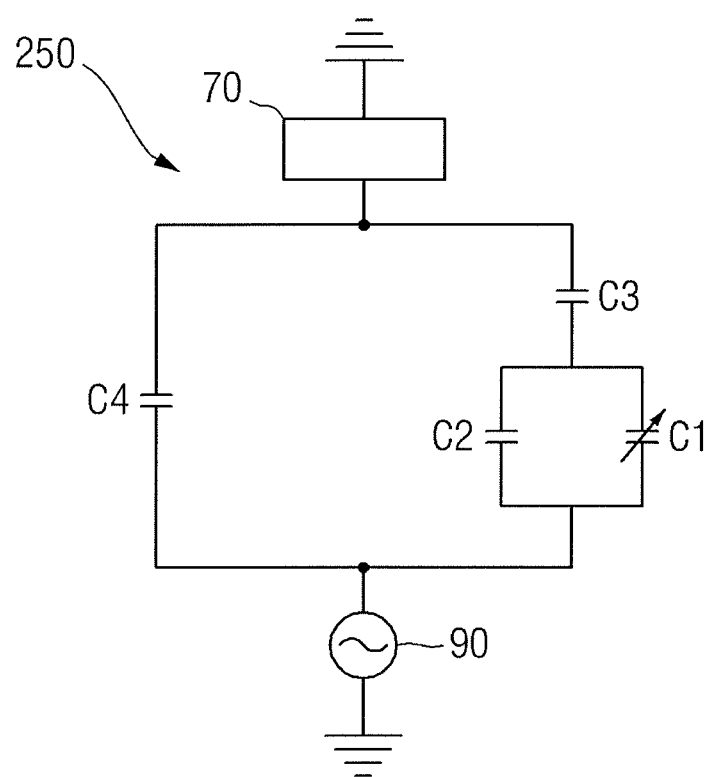
FIG. 6 illustrates a circuit diagram showing a circuit constituted by the plasma processing apparatus of FIG. 5.

FIG. 5 illustrates a schematic view showing a circuit constituted by the plasma processing apparatus according to an embodiment of the present disclosure, and FIG. 6 illustrates a circuit diagram showing a circuit constituted by the plasma processing apparatus of FIG. 5.

Referring to FIGS. 5 and 6, the plasma processing apparatus according to an embodiment of the present disclosure may form a capacitive path 250 with a plasma sheath formed by plasma used in the plasma processing process. For example, the plasma processing apparatus may form a capacitive path 250 including a plurality of capacitors C1, C2, C3, and C4.

The first capacitor C1 may be formed between the electrostatic chuck 10 and the edge ring 40. For example, the electrostatic chuck 10 and the edge ring 40, which may be made of a metallic material such as aluminum, may become two electrodes having a dielectric therebetween, and the gap 15 between the electrostatic chuck 10 and the edge ring 40 15 may constitute the first capacitor C1 as a dielectric.

During the plasma processing process by the plasma processing apparatus according to some embodiments of the present disclosure, the environment in the chamber 60 may be maintained in vacuum. Therefore, the gap 15 may also be maintained in vacuum, and the first capacitor C1 may be composed of a capacitor having a vacuum as a dielectric.

In the plasma processing apparatus according to some embodiments of the present disclosure, the first capacitor C1 may be a variable capacitor whose capacitance is adjustable. For example, the fluid controller 110 may adjust the capacitance of the first capacitor C1 by adjusting the temperature or amount of the fluid contained in the flow channel 45 provided in the edge ring 40. Details thereof will be described below.

The second capacitor C2 may be formed between the electrostatic chuck 10 and the focus ring 20. For example, the electrostatic chuck 10 made of a metallic material such as aluminum and the focus ring 20 containing silicon become two electrodes having a gap 15 maintained in vacuum therebetween, so as to constitute the second capacitor C2.

As shown in FIGS. 5 and 6, the first capacitor C1 and the second capacitor C2 may be connected in parallel to each other. When the capacitance of the first capacitor C1 increases, a sum of the capacitances of the first capacitor C1 and second capacitor C2 connected in parallel may also decrease. Conversely, when the capacitance of the first capacitor C decreases, the sum of the capacitances of the first capacitor C1 and the second capacitor C2 may also increase.

The third capacitor C3 refers to a capacitor formed between the focus ring 20 and the plasma sheath PS. The plasma sheath PS shown in FIG. 5 indicates a distribution of the electric field formed on the wafer W, the focus ring 20, and the insulation ring 30, e.g., an equipotential line. It is shown that the third capacitor C3 is formed between the upper electrode 70 and the first and second capacitors C1 and C2.

The third capacitor C3 may be connected in series with the first and second capacitors C1 and C2 to be included in the capacitive path 250.

The fourth capacitor C4 refers to a capacitor formed between the wafer W and the plasma sheath PS. The fourth capacitor C4 may be connected in parallel with the third capacitor (C3) or the first and second capacitors C1 and C2.

The total capacitance C of the capacitive path 250 viewed from the side of the upper electrode 70 is represented by the following equation. In the following equation, C1 to C4 refer to the capacitances of the first to fourth capacitors C1 to C4, respectively.

$$C = C4 + \left( \frac{1}{\frac{1}{C3} + \frac{1}{C1 + C2}} \right)$$

Figure 7:
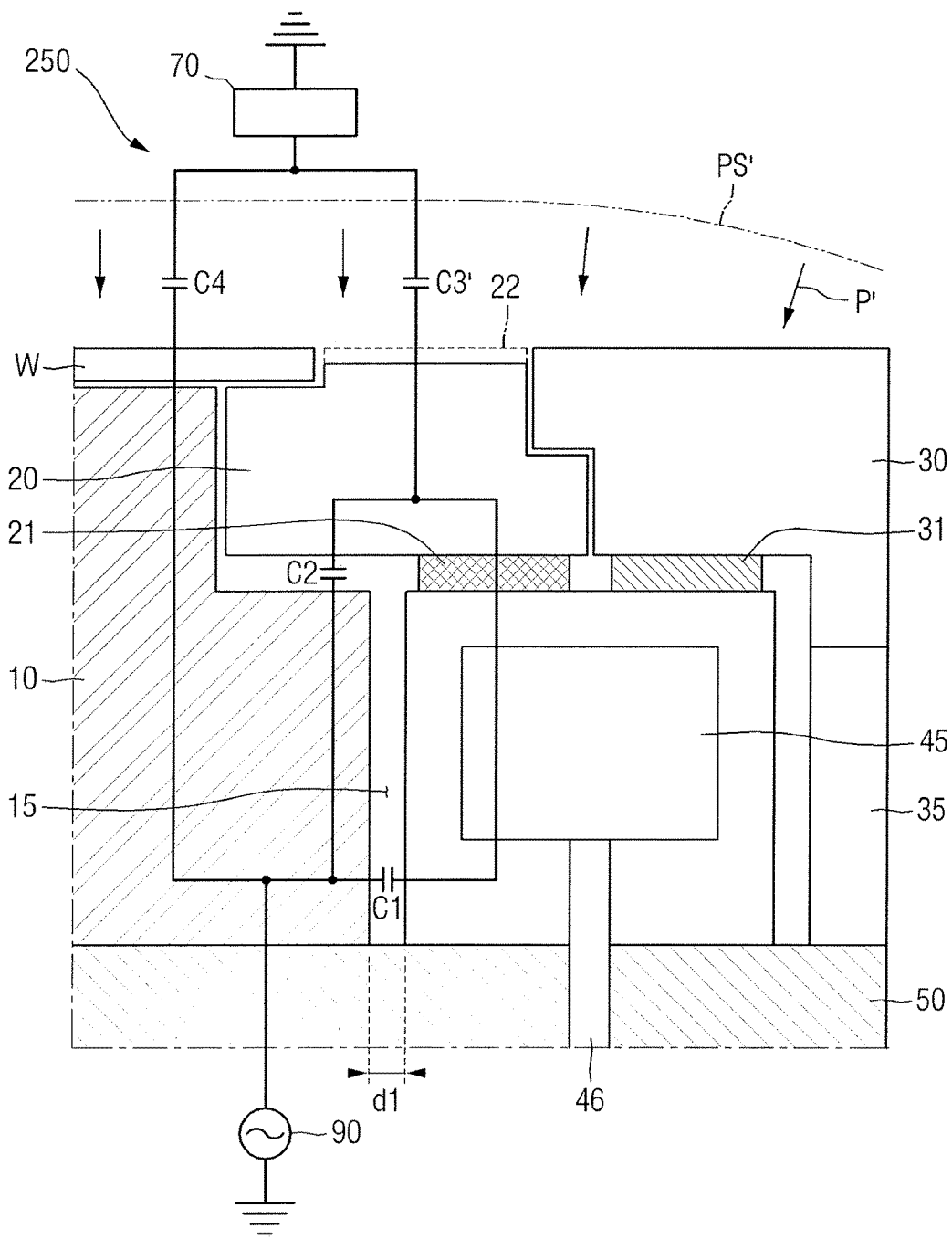
FIG. 7 illustrates a schematic view showing the state change due to the etching of a focus ring of a circuit constituted by a plasma processing apparatus according to some embodiments of the present disclosure.

FIG. 7 illustrates a schematic view showing the state change due to the etching of a focus ring of a circuit constituted by the plasma processing apparatus according to an embodiment of the present disclosure.

Referring to FIG. 7, a plasma processing process performed by the plasma processing apparatus according to some embodiments of the present disclosure may be performed. In this case, the upper surface of the focus ring 20 may also be partially etched, so that the focus ring 20 may have a deformed upper surface profile 22. FIG. 7 shows both the deformed upper surface profile 22 of the focus ring 20 and the plasma distribution P' and plasma sheath PS' changed due to the deformed upper surface profile 22.

Due to the deformed upper surface profile 22 of the focus ring 20, a change may occur in the third capacitor C3' between the focus ring 20 and the plasma sheath PS'. For example, due to the change in the upper surface profile 22 of the focus ring 20, a change may occur in the distance between the focus ring 20 and the plasma sheath PS', and thus the capacitance of the third capacitor C3' between the focus ring 20 and the plasma sheath PS' may be changed.

In addition, due to the change of the third capacitor C3', the distribution of an electric field on the upper surfaces of the wafer W, the focus ring 20 and the insulation ring 30 may be changed. This change in distribution of the electric filed is shown in FIG. 7 as the deformed plasma sheath PS'. Such a change of the plasma sheath PS' may cause an unbalance of a plasma distribution P' provided in the plasma processing process, and a process failure could occur.

Therefore, the plasma processing apparatus according to some embodiments of the present disclosure controls the fluid supplied to the flow channel 45 in the edge ring 40 so as to compensate for the changed plasma sheath PS'. Hereinafter, a method of compensating for the plasma sheath PS' through the control of the fluid supplied to the flow channel 45 will be described with reference to FIGS. 8 to 11.

Figure 8:
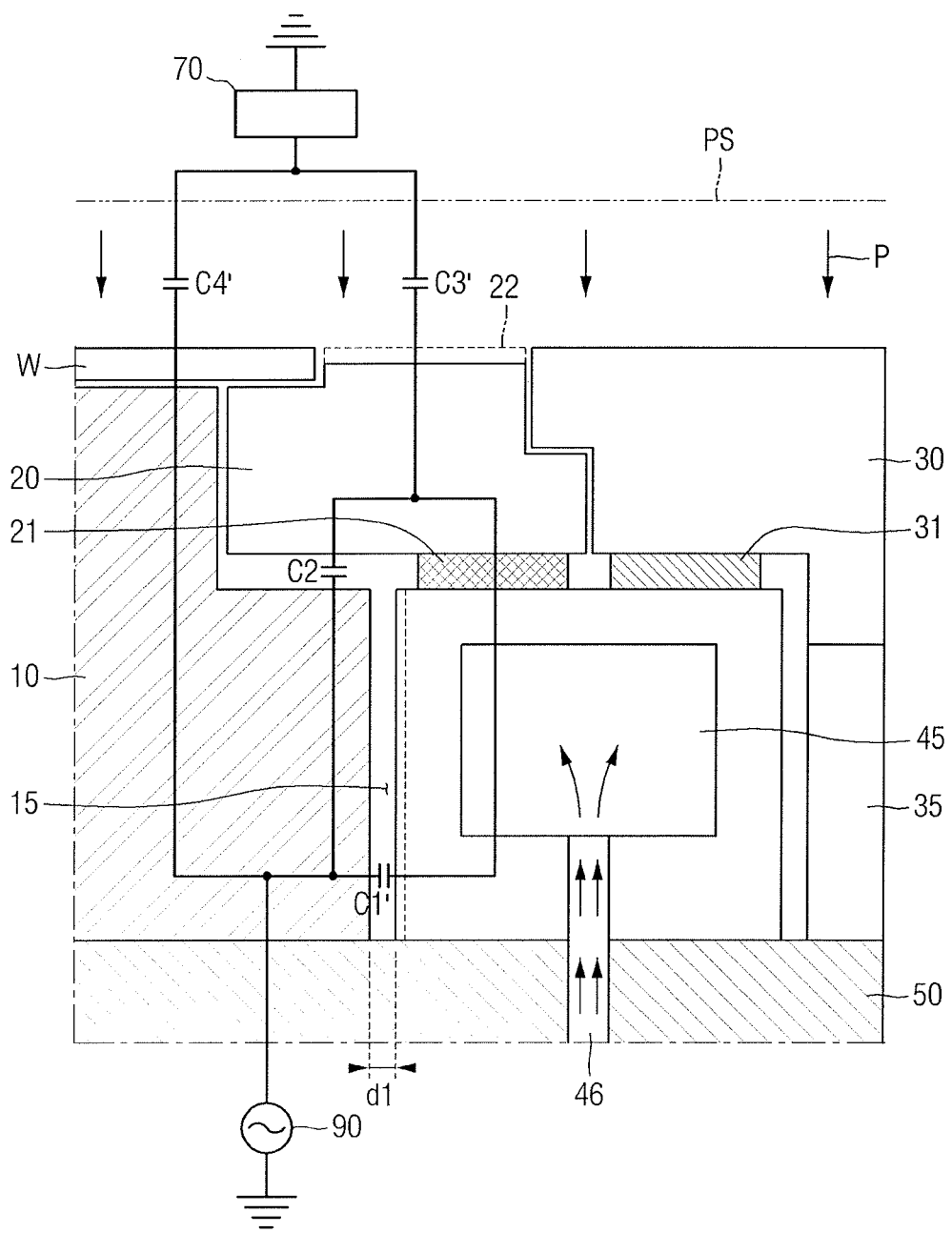
FIG. 8 illustrates a schematic view showing the operation of a plasma processing apparatus according to an embodiment of the present disclosure.

FIG. 8 illustrates a schematic view showing the operation of a plasma processing apparatus according to an embodiment of the present disclosure.

Referring to FIG. 8, the edge ring 40 included in the plasma processing apparatus according to an embodiment of the present disclosure may compensate for the total capacitance of the capacitive path 250 by using the fluid contained in the flow channel 45 provided in the edge ring 40.

As described above, the fluid contained in the flow channel 45 may facilitate the temperature change of the edge ring 40 and the temperature changes of the focus ring 20 and the insulating ring 30 due to the temperature change of the edge ring 40. Meanwhile, the edge ring 40 may undergo volume contraction or expansion due to its own temperature change.

The edge ring 40 may be provided with a fluid of a first temperature during the plasma processing process to cool the focus ring 20 and the insulation ring 30. In this case, the edge ring 40 may be maintained at a specific temperature by the fluid contained in the flow channel 45, and the volume of the edge ring 40 at this time will be maintained.

When a temperature change occurs in the fluid contained in the flow channel 45, a temperature at which the edge ring 40 is maintained may also change. A change in the volume of the edge ring 40 may occur due to the change in the temperature of the edge ring 40. A width d1 of the gap 15 between the electrostatic chuck 10 and the edge ring 40 may also change due to the change in the volume of the edge ring 40. When the width d1 of the gap 15 changes, the capacitance of the third capacitor C3 may change.

For example, when the temperature of the edge ring 40 becomes relatively high and thus the edge ring 40 expands, the width d1 of the gap 15 may decrease, and the capacitance of the third capacitor C3 may increase.

In contrast, when the temperature of the edge ring 40 becomes relatively low and thus the edge ring 40 contracts, the width d1 of the gap 15 may increase, and the capacitance of the third capacitor C3 may decrease.

Meanwhile, the total capacitance C of the capacitive path 250 viewed from the side of the upper electrode 70 may also change. In the above equation for C, if the capacitance of the third capacitor C3 decreases due to the contraction of the edge ring 40, the total capacitance (C) may increase. In contrast, if the capacitance of the third capacitor C3 increases due to the expansion of the edge ring 40, the total capacitance C may decrease.

As described above, in order to compensate for the change in the total capacitance C by the plasma processing process, the temperature of the fluid supplied to the flow channel 45 may be controlled.

In an implementation, the control of the temperature of the fluid may be performed by the fluid controller 110. For example, the fluid controller 110 may relatively increase the temperature of the fluid supplied to the flow channel 45 to decrease the total capacitance C in the capacitive path 250, whereas may relatively decreases the temperature of the fluid to increase the total capacitance C.

As shown in FIG. 8, the plasma processing apparatus according to an embodiment of the present disclosure may compensate for the plasma sheath PS and the plasma distribution P through the temperature control of the fluid supplied to the flow channel 45 by the fluid controller 110 such that they are the same as those before the change of the upper surface profile 22 of the focus ring.

In an implementation, the fluid controller 110 may receive the measured values of the deformed plasma distribution P' or plasma sheath PS' from the electric field measurement device disposed in the chamber 60, and may calculate the change amount of the volume of the edge ring 40 and the temperature of the fluid in order to compensate for the capacitance C, based on these results.

Figure 9:
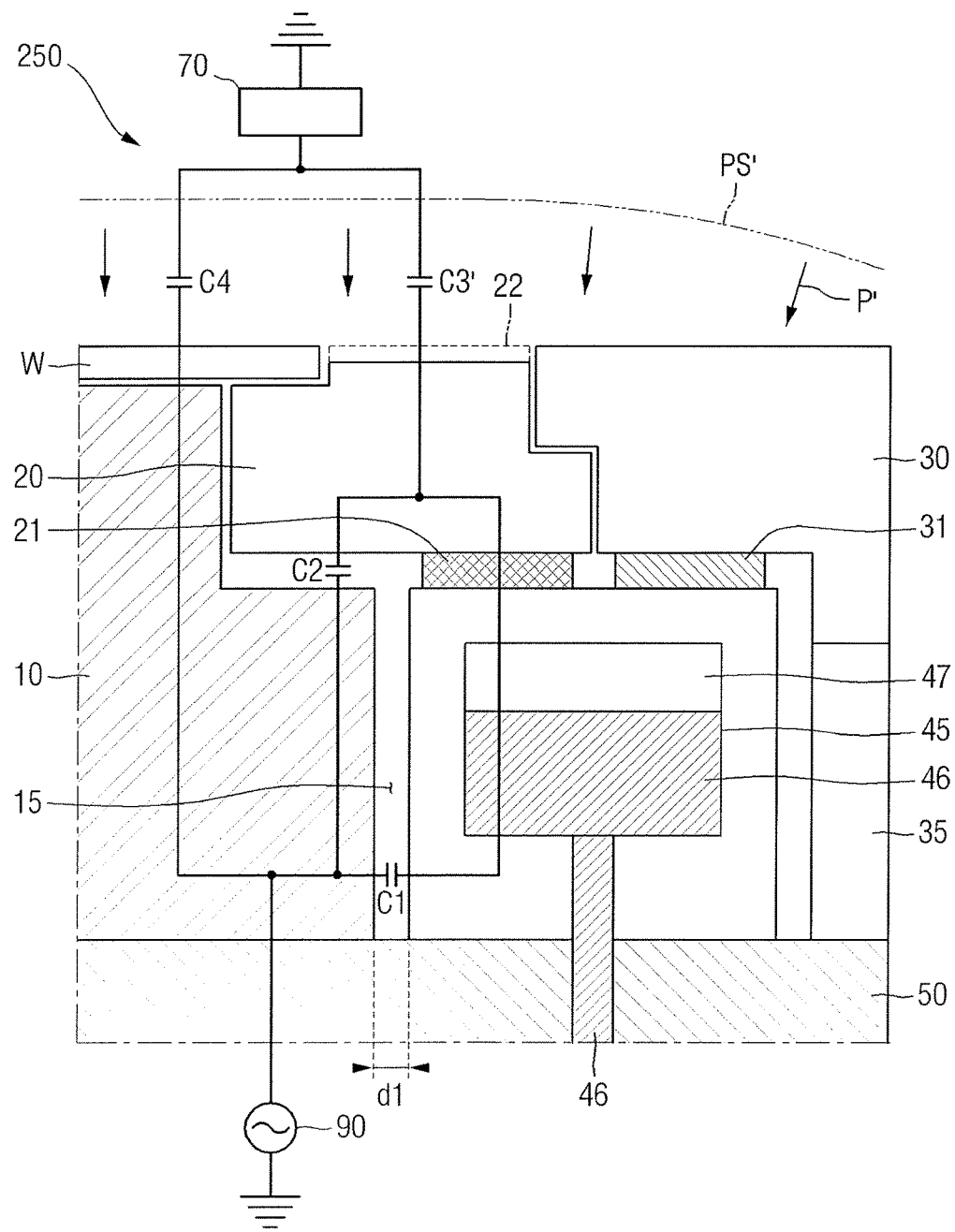
FIG. 9 illustrates a schematic view showing the operation of a plasma processing apparatus according to another embodiment of the present disclosure.

FIG. 9 illustrates a schematic view showing the operation of a plasma processing apparatus according to another embodiment of the present disclosure.

Referring to FIG. 9, similar to the above-described embodiment, due to the influence of the plasma supplied during the plasma processing process, the focus ring 20 may have a deformed upper surface profile 22, and thus deformed plasma sheath PS' and plasma distribution P' could occur.

It is shown in FIG. 9 that the flow channel 45 is filled with a fluid. The plasma processing apparatus according to another embodiment of the present disclosure may control the amount of the fluid in the flow channel 45 to compensate for the total capacitance of the capacitive path 250.

Figure 10:
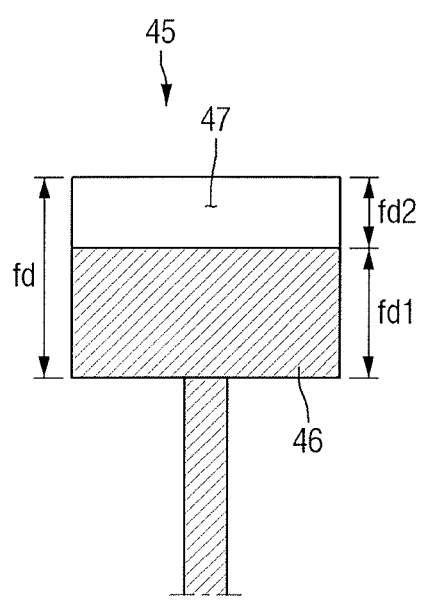
FIG. 10 illustrates a schematic view showing a flow channel provided in an edge ring included in a plasma processing apparatus according to some embodiments of the present disclosure.

FIG. 10 illustrates a schematic view showing a flow channel provided in an edge ring included in the plasma processing apparatus according to another embodiment of the present disclosure.

Referring to FIG. 10, it is shown that the flow channel 45 in the edge ring 40 is partially filled with a fluid. In an implementation, as shown in FIG. 10, the flow channel 45 may be filled with a liquid fluid to a first level fd1. In an implementation, the flow channel 45 in vacuum may be filled with a gas fluid, and, in this case, the fluid controller 110 may calculate a ratio of the volume of the supplied fluid to the volume of the flow channel 45 to calculate the capacitance on the capacitive path 250.

In the plasma processing apparatus according to some embodiments of the present disclosure, the edge ring 40 may constitute a capacitor on the capacitive path 250, and the flow channel 45 in the edge ring 40 and the fluid contained in the flow channel 45 may constitute a dielectric of the capacitor. It may be understood that this capacitor is serially connected with the first capacitor C1.

In this case, the dielectric constant of the dielectric and the capacitance of the capacitor may be controlled by adjusting the ratios among the total depth fd of the flow channel 45, the level fd1 of the fluid 46, and the depth fd2 of the vacuum portion 47.

Figure 11:
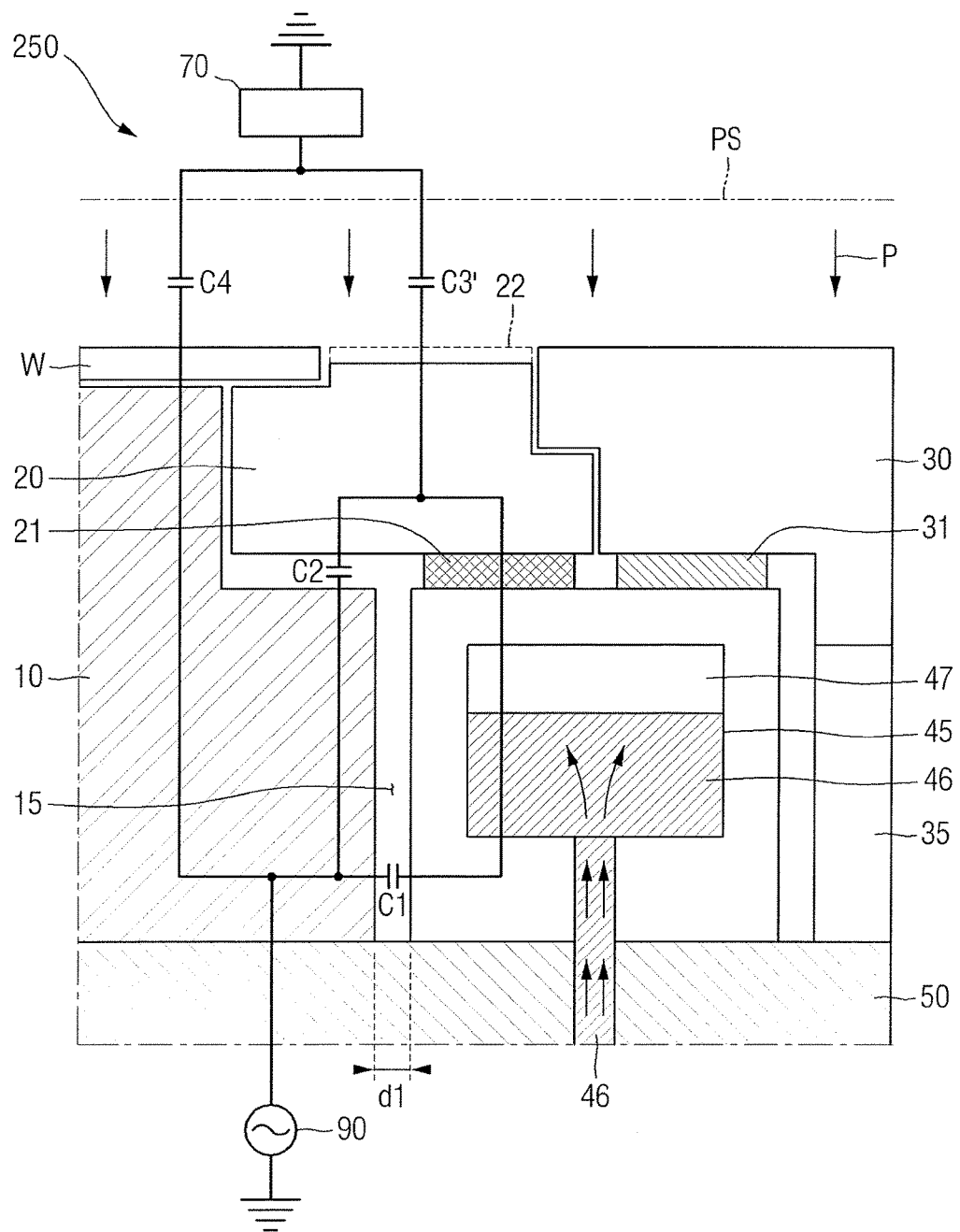
FIG. 11 illustrates a schematic view showing the operation of a plasma processing apparatus according to still another embodiment of the present disclosure.

FIG. 11 illustrates a schematic view showing the operation of a plasma processing apparatus according to still another embodiment of the present disclosure.

Referring to FIG. 11, the fluid controller 110 may calculate the amount of a fluid in the flow channel 45 to control the ratio of the fluid 46 and the vacuum portion 47. Thus, the dielectric constant of the dielectric formed by the edge ring 40 and the capacitance of the capacitor may be changed to compensate for the deformed third capacitor C3' and the plasma sheath PS' and plasma distribution P' due to this deformed third capacitor C3'.

In an implementation, the fluid controller 110 may receive the measured values of the deformed plasma distribution P' or plasma sheath PS' from the electric field measurement device disposed in the chamber 60, and may calculate the amount of the fluid contained in the flow channel 45 in order to compensate for the capacitance C, based on these results.

By way of summation and review, temperature control of the semiconductor wafer may be performed by way of a cooling flow channel for circulating a coolant inside the body of the electrostatic chuck during a plasma processing process. In this case, an additional mechanism for controlling the temperature of the focus ring or the insulation ring may not be included, and the temperature of the focus ring or the insulation ring could rapidly increase upon exposure to plasma. Such a rapid temperature increase could influence the etching amount of the edge portion of the semiconductor wafer, so as to cause a process failure.

Components, such as an electrostatic chuck for generating plasma between a lower electrode and an upper electrode, a focus ring, and an edge ring, may constitute one capacitive path. As a plasma processing process proceeds, it may be desirable to compensate for a capacitance change occurring in such a capacitive path to maintain uniformity of the entire process.

The embodiments may provide a plasma processing apparatus including an edge ring provided therein with a flow channel for containing a fluid.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A plasma processing apparatus, comprising:
   an electrostatic chuck supporting a wafer;
   a focus ring disposed to surround an outer circumferential surface of the wafer;
   an insulation ring disposed to surround an outer circumferential surface of the focus ring; and
   an edge ring supporting lower portions of the focus ring and the insulation ring, the edge ring being spaced apart from the electrostatic chuck and surrounding an outer circumferential surface of the electrostatic chuck;
   wherein the edge ring includes a flow channel containing a fluid therein,
   wherein the fluid includes a coolant, and
   wherein the edge ring cools the focus ring and the insulation ring with the fluid.

2. The plasma processing apparatus as claimed in claim 1, further comprising:
   a first pad interposed between the focus ring and the edge ring; and
   a second pad interposed between the insulation ring and the edge ring.

3. The plasma processing apparatus as claimed in claim 2, wherein:
   a first contact area of the first pad and the focus ring has a first size, and
   a second contact area of the second pad and the insulation ring has a second size, the second size being different from the first size.

4. The plasma processing apparatus as claimed in claim 1, wherein the focus ring contains materials that are different from materials contained in the insulation ring.

5. The plasma processing apparatus as claimed in claim 1, wherein the flow channel includes:
   a first flow channel disposed to vertically overlap a contact surface between the focus ring and the edge ring; and
   a second flow channel disposed to vertically overlap a contact surface between the insulation ring and the edge ring.

6. The plasma processing apparatus as claimed in claim 5, wherein:
   the fluid includes a first fluid and a second fluid, the second fluid being maintained at a temperature that is different from a temperature at which the first fluid is maintained,
   the first fluid is contained in the first flow channel, and
   the second fluid is contained in the second flow channel.

7. The plasma processing apparatus as claimed in claim 1, further comprising a gap between the edge ring and the electrostatic chuck, wherein the edge ring changes a width of the gap depending on a temperature of the fluid contained in the flow channel.

8. A plasma processing apparatus, comprising:
   a plasma chamber supplied with plasma;
   an electrostatic chuck disposed in the plasma chamber and supporting a wafer;
   an edge ring spaced apart from the electrostatic chuck, the edge ring surrounding an outer circumferential surface of the electrostatic chuck and including a flow channel containing a fluid therein;
   a focus ring surrounding an outer circumferential surface of the wafer and disposed on the edge ring; and
   a fluid controller to control a supply of the fluid contained in the flow channel of the edge ring,
   wherein:
   the edge ring and the electrostatic chuck form a capacitor, and
   the fluid controller controls an amount and temperature of the fluid contained in the edge ring.

9. The plasma processing apparatus as claimed in claim 8, further comprising a gap between the edge ring and the electrostatic chuck.

10. The plasma processing apparatus as claimed in claim 9, wherein:
    the fluid controller supplies the fluid to expand the edge ring, the fluid having a temperature that exceeds a reference temperature, and a width of the gap is decreased by expansion of the edge ring.

11. The plasma processing apparatus as claimed in claim 10, wherein capacitance of the capacitor is increased by the expansion of the edge ring.

12. The plasma processing apparatus as claimed in claim 8, wherein the fluid controller controls capacitance of the capacitor by adjusting an amount of the fluid contained in the edge ring.

13. The plasma processing apparatus as claimed in claim 8, wherein:
the electrostatic chuck forms a capacitive path with a plasma sheath formed by plasma, and
the capacitive path includes the capacitor formed by the edge ring and the electrostatic chuck.

14. A plasma processing apparatus, comprising:
an electrostatic chuck on which a wafer is supportable;
a focus ring surrounding an outer circumferential surface of a location where the wafer is to be supported;
an insulation ring surrounding an outer circumferential surface of the focus ring; and
an edge ring supporting the focus ring and the insulation ring, the edge ring being spaced apart from the electrostatic chuck and surrounding an outer circumferential surface of the electrostatic chuck;
wherein the edge ring includes a flow channel through which a fluid is flowable,
wherein the fluid includes a coolant, and
wherein the edge ring cools the focus ring and the insulation ring with the fluid.

15. The plasma processing apparatus as claimed in claim 14, wherein:
the focus ring includes a first pad contacting the edge ring,
the insulation ring includes a second pad contacting the edge ring,
a first contact area of the first pad and the focus ring has a first size, and
a second contact area of the second pad and the insulation ring has a second size, the second size being different from the first size.

16. The plasma processing apparatus as claimed in claim 14, wherein the flow channel includes:
a first flow channel aligned with a contact surface between the focus ring and the edge ring; and
a second flow channel aligned with a contact surface between the insulation ring and the edge ring.

17. The plasma processing apparatus as claimed in claim 14, wherein a plasma concentration is uniform across a surface of the wafer during operation of the plasma processing apparatus.

18. The plasma processing apparatus as claimed in claim 17, wherein the plasma concentration is maintained in a uniform state in response to the focus ring and the insulation ring being maintained at a same temperature.

* * * * *